(12) United States Patent
Buchmann et al.

(10) Patent No.: US 8,645,620 B2
(45) Date of Patent: Feb. 4, 2014

(54) APPARATUS AND METHOD FOR ACCESSING A MEMORY DEVICE

(75) Inventors: Peter Buchmann, Wald (CH); Martin Leo Schmatz, Rueschlikon (CH); Jan Van Lunteren, Gattikon (CH)

(73) Assignee: International Business Machines Corporation, Armonk, NY (US)

( * ) Notice: Subject to any disclaimer, the term of this patent is extended or adjusted under 35 U.S.C. 154(b) by 931 days.

(21) Appl. No.: 12/143,889

(22) Filed: Jun. 23, 2008

(65) Prior Publication Data
US 2009/0006782 A1 Jan. 1, 2009

(30) Foreign Application Priority Data

Jun. 29, 2007 (EP) ..................................... 07111444

(51) Int. Cl.
*G06F 12/00* (2006.01)
(52) U.S. Cl.
USPC ..... 711/108; 711/129; 711/105; 711/E12.078
(58) Field of Classification Search
None
See application file for complete search history.

(56) References Cited

U.S. PATENT DOCUMENTS

| | | | | |
|---|---|---|---|---|
| 5,383,146 A | * | 1/1995 | Threewitt | 365/49.17 |
| 5,408,434 A | * | 4/1995 | Stansfield | 365/189.08 |
| 5,809,539 A | * | 9/1998 | Sakakibara et al. | 711/151 |
| 6,023,281 A | * | 2/2000 | Grigor et al. | 345/543 |
| 6,633,953 B2 | * | 10/2003 | Stark | 711/108 |
| 6,775,737 B1 | * | 8/2004 | Warkhede et al. | 711/108 |
| 6,782,382 B2 | | 8/2004 | Lunteren | |
| 6,839,800 B2 | * | 1/2005 | Stark | 711/108 |
| 7,185,141 B1 | * | 2/2007 | James et al. | 711/108 |
| 2004/0001380 A1 | * | 1/2004 | Becca et al. | 365/202 |
| 2004/0068607 A1 | * | 4/2004 | Narad | 711/108 |
| 2008/0189481 A1 | * | 8/2008 | Mayer et al. | 711/111 |

* cited by examiner

*Primary Examiner* — Matthew Bradley
*Assistant Examiner* — Arvind Talukdar
(74) *Attorney, Agent, or Firm* — Cantor Colburn LLP

(57) ABSTRACT

An interfacing apparatus and related method is provided for configuring to couple a plurality of memory devices being addressable by means of an address space to a processing unit. In one embodiment, the apparatus comprises a first memory access unit being adapted for receiving a memory address from said processing unit and for accessing said memory devices accordingly based on the address provided. It also comprises a second memory access unit being adapted for receiving content data from the processing unit and for controlling a search or update function accordingly for the received content data in one or more of the memory devices. In addition, an allocation unit is also provided for allocating a first part of the address space of the memory devices to said first memory access unit and allocating a second part of the address space of said memory devices to the second memory access unit, each of the memory access units being assigned to corresponding memory devices of the plurality of memory devices.

19 Claims, 9 Drawing Sheets

APPARATUS AND METHOD FOR ACCESSING A MEMORY DEVICE

CROSS REFERENCE TO RELATED APPLICATION

This application claims priority under USC§119 from European Patent Application number 07111444.1, filed on Jun. 29, 2007, the entire contents of which are incorporated herein by reference.

BACKGROUND OF THE INVENTION

1. Field of the Invention

The invention relates to an apparatus for coupling a memory device to a processing unit. The invention relates further to a corresponding method and a corresponding computer program for accessing a memory device.

2. Description of the Related Art

Search algorithms are components of many applications and may have considerable impact on the overall performance. Most search algorithms involve multiple steps that each process a different part of an input key and each involve a memory access. One example is a tree search, in which a tree is "walked" in multiple steps, each involving the selection of a branch from a parent node to a child node based on some portion of the input key, until some final node has been reached. Each branch to a next tree node involves a memory access to obtain information for the search algorithm (e.g., address of parent node, number of child nodes and their addresses). All the memory accesses involved in a single search operation are dependent on each other. As a result, the individual latencies of all these memory accesses will contribute to the total latency of a single search operation.

New generations of Dynamic Random Access Memory (DRAM)-based memory systems are able to increase the total memory throughput, while the access latency is improved in a very limited way. Application of caches can be used to decrease access latency, however, only for data having spatial and temporal locality properties.

It is an object of the invention to provide improved solutions for accessing a memory device.

SUMMARY OF THE INVENTION

The present invention is directed to an apparatus, a method and a computer program as defined in the independent claims. Further embodiments of the invention are provided in the appended dependent claims.

According to a first aspect of the invention there is provided an apparatus for coupling a memory device being addressable by means of an address space to a processing unit, the apparatus including a first memory access unit being adapted for receiving a memory address from the processing unit and for accessing the memory device by the received memory address, a second memory access unit being adapted for receiving content data from the processing unit and for controlling a search for the received content data in the memory device, an allocation unit for allocating a first part of the address space of the memory device to the first memory access unit and a second part of the address space of the memory device to the second memory access unit.

The apparatus according to the first aspect of the invention can be used as an interface between the memory device and the processing unit. The apparatus provides enhanced flexibility for the use of memory devices. By means of the apparatus according to the first aspect of the invention the address space of the memory device can be configured and used simultaneously in two different ways.

On the one hand, it can be used by means of the first memory access unit for a direct and random memory access that is based on a memory address received from the processing unit. In other words, the first memory access unit is adapted for receiving a memory address from the processing unit and for returning the content or the values respectively stored under the received memory address to the processing unit.

On the other hand the address space can be used for a search operation that is controlled by the second memory access unit. The second memory access unit is adapted for receiving content data, e.g. an input key, from the processing unit and for performing a search for the received content data in the second address space of the memory device. The search can be controlled and performed by the second memory access unit without involving the processing unit. Hence the processing unit is offloaded. The search may involve one or more accesses of the memory device by the second memory access unit. The offloading of the processing unit saves interconnect/bus cycles between the processing unit and the memory device. Furthermore, by integrating the search function close to the memory device, the latency for each memory access as well as the total search latency is reduced. This increases the search performance.

The first aspect of the invention has the further advantage that it allows the use of common interfaces provided between a processing unit and a memory device without further amendments. In particular it allows the use of interfaces or bus systems respectively based on address, data and control lines.

According to an embodiment of the first aspect of the invention the memory of the second part of the address space of the memory device is provided for storing one or more search structures. A search structure is a data structure that stores content data in a structured way that allows a search for the content data by means of a respective search algorithm. Such a search structure facilitates an efficient search. The search structure may be provided in particular in the form of tree-structured search tables.

According to a further embodiment of the first aspect of the invention the allocation unit includes one or more address range registers for storing address ranges of the first part of the address space and of the second part of the address space.

Such address range registers are a flexible and efficient means for allocating one or more first parts of the address space to the first memory access unit and one or more second parts of the address space to the second memory access unit. The address range registers are provided for storing the boundaries between the first parts of the address space being allocated to the first memory access unit and the second parts of the address space being allocated to the second memory access unit.

According to further embodiment of the first aspect of the invention the allocation unit includes a comparator for comparing memory addresses received from the processing unit with the address ranges stored in the address range registers and for activating the first memory access unit or the second memory access unit in dependence on the received memory address.

This is an efficient and flexible solution for activating the first memory access unit or the second memory access unit. The processing unit may perform a selection between the first memory access unit and the second memory access unit solely by means of the memory address without sending separate control signals to the apparatus.

According to a further embodiment of the first aspect of the invention the address range registers are adapted for a direct access by the processing unit.

This enables the processing unit to amend or update the address ranges being allocated to the first part of the address space and the second part of the address space. It provides enhanced flexibility and can e.g. be used to store additional search structures in the memory device by enlarging the second part of the address space.

According to a further embodiment of the first aspect of the invention the address ranges of the address range registers are mapped on address range select values for selecting one of the address ranges by the processing unit.

Such address range select values can be used to select a particular address range in the address space. This saves bits to be sent by the processing unit, as the processing unit may only send the select value, but not the complete memory address. The assignment of select values is in particular useful for the second part of the address space allocated to the second memory access unit. This allows the processing unit to select between search structures or search tables respectively that are stored within a specific area or region of the second part of the address space. The remaining bits of the address field can be used for other purposes, e.g. for an input key comprising content data to be searched for in the corresponding search structure of the second part of the address space.

According to a further embodiment of the first aspect of the invention the second memory access unit includes an update unit for updating the search structure stored in the memory device.

The update unit enables the processing unit to update search structures stored in the second part of the address space by adding and/or removing and/or amending search entries. Such search entries may e.g. consist of a search key and a corresponding search result and may be written as additional search entries in the respective search structure. The search key may be e.g. a name and the search result the address corresponding to this name.

According to a further embodiment of the first aspect of the invention the apparatus includes a scheduler for scheduling the access to the memory device between the first memory access unit and the second memory access unit.

The scheduler is provided for preventing memory access collisions between the first memory access unit and the second memory access unit.

According to a further embodiment of the first aspect of the invention the apparatus is provided for interfacing the memory device and the processing unit by means of a parallel bus system comprising address, data and control lines.

According to a further embodiment of the first aspect of the invention the apparatus is provided for interfacing the memory device and the processing unit by means of a serial bus system.

A second aspect of the invention relates to a memory controller that includes an apparatus according to the first aspect of the invention.

Such a memory controller allows for performing successive memory device accesses involved in each search operation very local to the memory device. The memory controller may exchange only an input key and the search results for the input key with the application that is executed on the processing unit.

According to a third aspect of the invention a memory buffer comprising an apparatus according to the first aspect of the invention is provided.

Such a memory buffer allows for performing successive memory device accesses involved in each search operation very local to the memory device. The memory buffer is arranged between the memory controller and the memory devices. Such a memory buffer may exchange only an input key and the search results for the input key with the application that is executed on the processing unit. The memory buffer may be in particular an advanced memory buffer (AMB). The advanced memory buffer is preferably arranged on a Fully Buffered Dual Inline Memory Module (FB-DIMM). FB-DIMMs are connected point-to-point. This means the memory controller is connected to a first FB-DIMM, the first FB-DIMM is coupled to a second FB-DIMM, the second FB-DIMM is connected to a third FB-DIMM etc. This is called a daisy chain. Preferably each FB-DIMM includes an AMB. An AMB includes preferably two serial ports and a parallel port. One of the serial ports is for upstream communication and the other one for downstream communication. The parallel port is provided for connecting the AMB to the memory devices (memory chips) of the respective FB-DIMM. Details of FB-DIMMs and corresponding AMBs have been standardized by the Joint Electron Device Engineering Council (JEDEC)-association.

According to a fourth aspect of the invention a computer system comprising a central processing unit, a memory device and an apparatus according to the first aspect of the invention is provided.

Such a computer system allows for performing successive memory device accesses involved in each search operation very local to the memory device. The apparatus according to the first aspect of the invention establishes an interface between the processing unit and the memory device and may exchange only an input key and the search results for the input key with the application that is executed on the processing unit.

A fifth aspect of the invention relates to a method for accessing a memory device being addressable by means of an address space, the method including the steps of:

sending a memory address by a processing unit to an allocation unit;

comparing by the allocation unit the received memory address with a first part of the address space of the memory device and with a second part of the address space of the memory device;

accessing the memory device by the received memory address, if the received address is in the first part of the address space; and receiving content data and performing a search for the received content data in the memory device, if the received memory address is in the second part of the address space.

A sixth aspect of the invention relates to a computer program comprising instructions for carrying out the steps of the method according to fifth aspect of the invention.

Any disclosed embodiment may be combined with one or several of the other embodiments shown and/or described. This is also possible for one or more features of the embodiments.

Any feature of one aspect of the invention may be applied to another aspect of the invention and vice versa.

The invention further provides a storage medium tangibly embodying a program of machine readable instructions executable by a digital processing apparatus to carry out a method of accessing a memory device being addressable by means of an address space.

Preferred embodiments of the present invention are described in detail below, by way of example only, with reference to the following schematic drawings.

DETAILED DESCRIPTION OF THE PREFERRED EMBODIMENTS

The drawings are provided for illustrative purposes only and do not necessarily represent practical examples of the present invention to scale. In the figures, same reference signs are used to denote the same or like parts.

Figure 1:
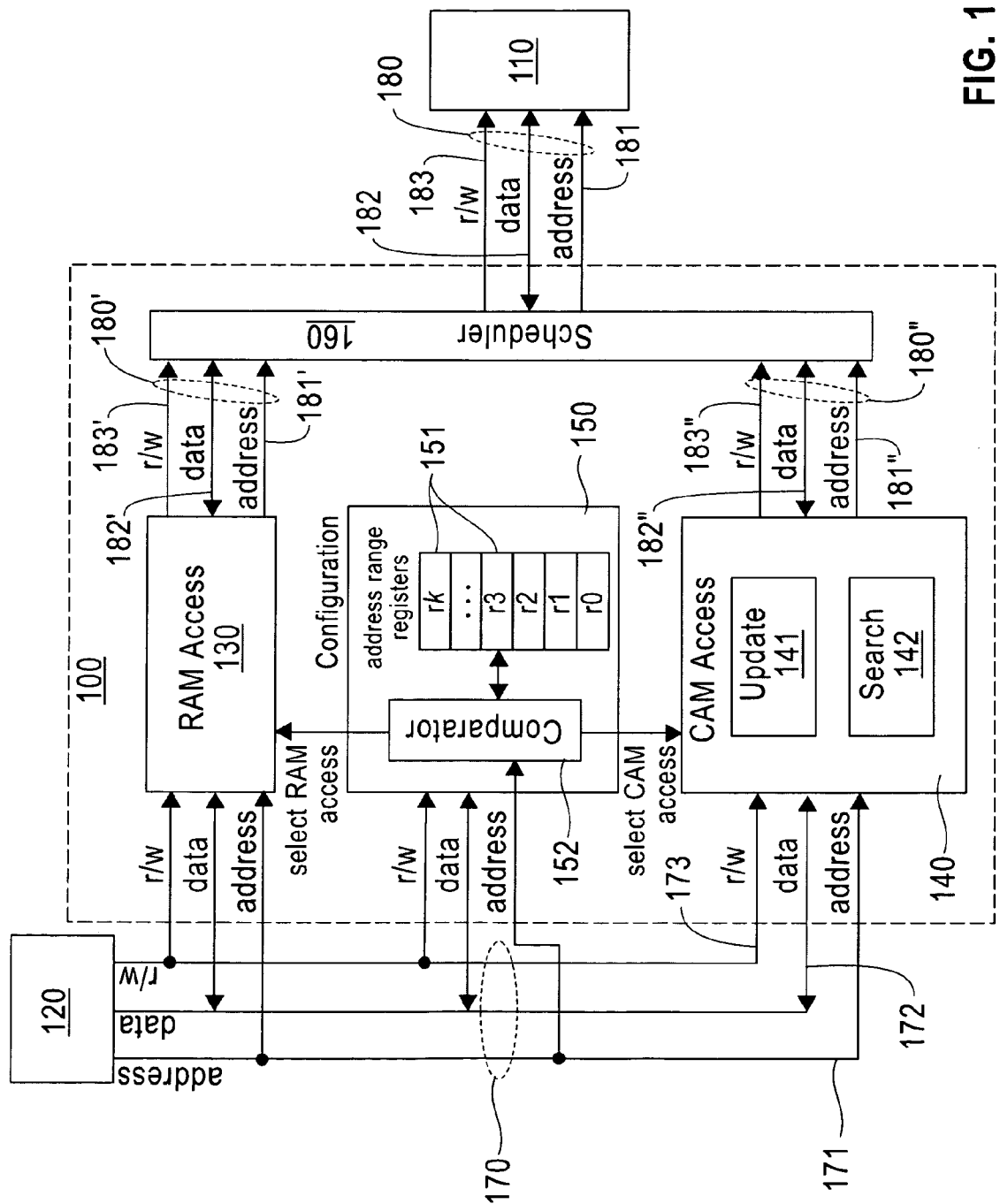
FIG. 1 is a schematic drawing of an apparatus for coupling a memory device to a processing unit according to an embodiment of the invention.

FIG. 1 shows a schematic drawing of an apparatus 100 embodying the invention. The apparatus 100 is provided for coupling a memory device 110 to a processing unit 120. The memory device 110 can be addressed by means of an address space.

The apparatus 100 includes a first memory access unit 130, a second memory access unit 140, an allocation unit 150 and a scheduler 160. The first memory access unit 130, the second memory access unit 140 and the allocation unit 150 are coupled via a bus system 170 to the processing unit 120. The first memory access unit 130 is coupled to the scheduler 160 via a bus system 180'. The second memory access unit 140 is coupled via a bus system 180" to the scheduler 160 and the scheduler 160 is coupled via the bus system 180 to the memory device 110.

The bus system 170 is a parallel bus system and includes address lines 171, data lines 172 and control lines 173. The bus system 180 is a parallel bus system and includes address line 181, data line 182 and control line 183. The bus system 180' is a parallel bus system and includes address line 181', data line 182' and control line 183'. The bus system 180" is a parallel bus system and includes address line 181", data line 182" and control line 183".

The allocation unit 150 includes address range registers 151 for storing address ranges of a first part of the address space and of a second part of the address space. Furthermore, the allocation unit includes a comparator 152 for comparing memory addresses received from the processing unit 120 with the address ranges stored in the address range registers 151 and for activating the first memory access unit 130 or the second memory access unit 140 in dependence on the received memory address. If the received memory address belongs to the first part of the address space, the comparator 152 sends a "Select RAM-access" signal to the first memory access unit 130. This activates the first memory access unit 130 and the first memory access unit 130 performs an access of the memory device 110 by means of the memory address received via the address lines 171. The memory access of the first memory access unit 130 corresponds to a common random memory access.

If the memory address received by the comparator 152 belongs to the second part of the address space, the comparator 152 sends a "Select CAM-access" signal to the second memory access unit 140. This activates the second memory access unit 140.

The second memory access unit 140 includes an update unit 141 and a search unit 142. The update unit 141 is provided for updating a search structure stored in the memory device 110. The search unit 142 is provided for controlling a search in the memory device 110.

Upon activation, the second memory access unit 140 evaluates whether content data received via the address lines 171, the data lines 172 and the control lines 173 belongs to an update or a search operation. The data formats for an update or a search operation are predefined. In case of a search operation, the search unit 142 receives content data such as an input key via the bus system 170 and controls a search for the input key in the memory device 110. When the search has been finished, the search unit 142 outputs the search result via the bus system 170 to the processing unit 120. During the search operation the search unit works independently from the processing unit 120 and may perform one or more read-accesses of the memory device 110. The search operation of the second memory access unit 140 corresponds to a content addressable memory (CAM)-access. In other words, the search unit 142 emulates a content addressable memory.

In case of an update operation, the update unit 141 receives content data such as new search entries via the bus system 170. The update unit 141 controls and performs an update of the search structure that is stored in the memory device 110. During the update operation the search unit may perform one or more write- and/or read accesses.

Figure 2:
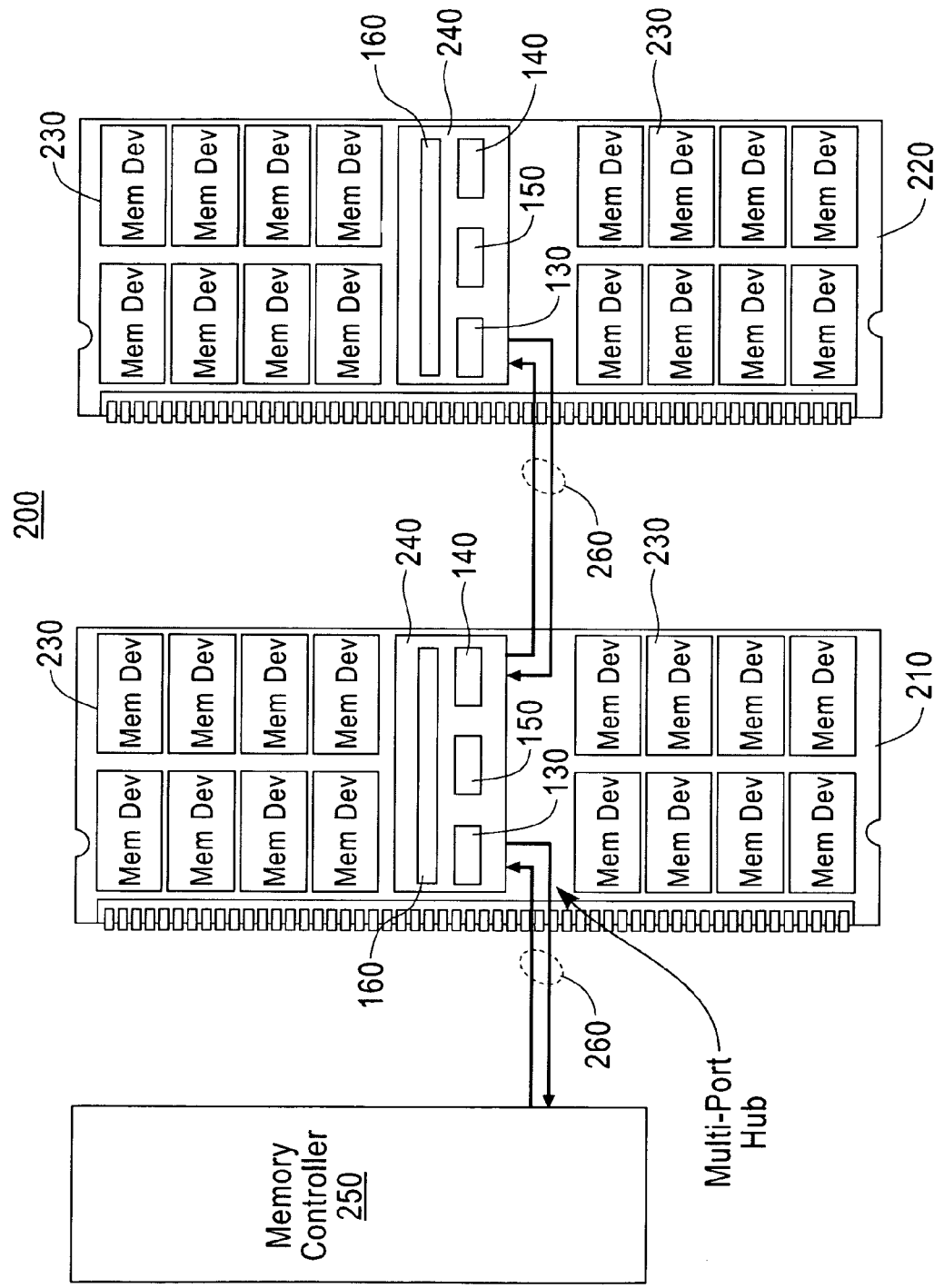
FIG. 2 shows a schematic drawing of a memory system comprising the apparatus of FIG. 1 arranged in memory buffers of a memory system.

FIG. 2 shows a memory system 200 embodying the invention. The memory system 200 includes a first memory block 210 and a second memory block 220. Each of the memory blocks 210 and 220 includes 16 memory devices 230. The memory devices 230 may be e.g. memory chips. Each of the memory blocks 210 and 220 includes a memory buffer 240 that functions as a hub. The memory buffers 240 of the memory blocks 210 and 220 are coupled with each other and with a memory controller 250 by means of a bus system 260.

The memory system 200 may be in particular a memory system based on Fully Buffered Dual Inline Memory Modules (FB-DIMM). In such an embodiment the memory buffers 240 represent Advanced Memory Buffers (AMB) of such a FB-DIMM memory system and each of the memory blocks 210 and 220 represents a FB-DIMM. Furthermore, the bus system 260 represents a point-to-point serial interface that connects the memory controller 250 with the memory buffer 240 of the first memory block 210 as well as the memory buffer 240 of the first memory block 210 with the memory buffer 240 of the second memory block 220 in a daisy chain manner. A not shown parallel bus system is provided for connecting the memory buffers 240 to the memory devices (memory chips) 230.

Each of the memory buffers 240 includes a first memory access unit 130, a second memory access unit 140, an allocation unit 150 and a scheduler 160 as described with reference to FIG. 1.

Figure 3:
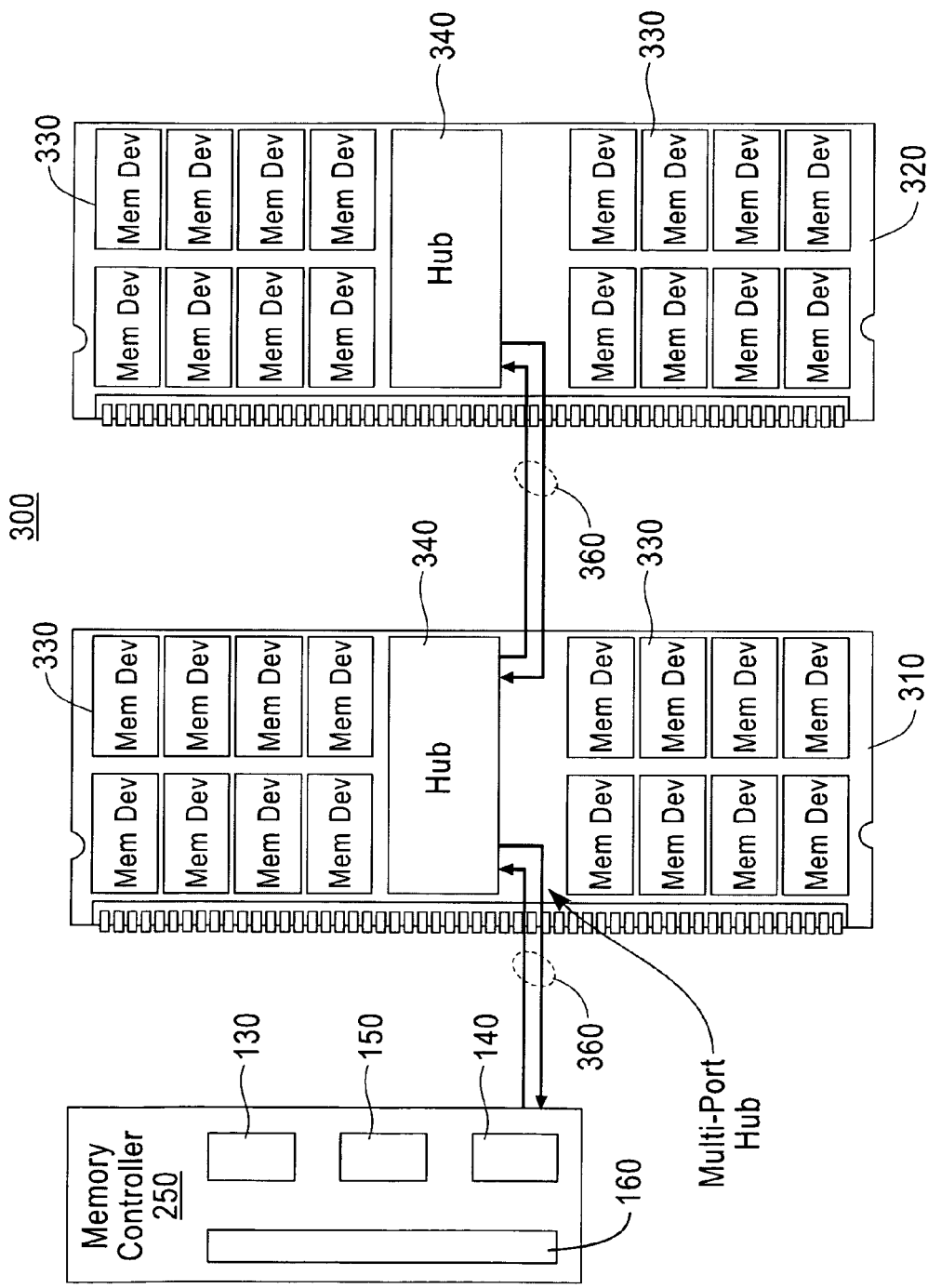
FIG. 3 shows a schematic drawing of a memory system comprising the apparatus of FIG. 1 arranged in a memory controller of a memory system.

FIG. 3 shows a memory system 300 embodying the invention. The memory system 300 includes a first memory block 310 and a second memory block 320. Each of the memory blocks 310 and 320 includes 16 memory devices 330. The memory devices 330 may be e.g. memory chips. Each of the memory blocks 310 and 320 includes a memory buffer 340 that functions as a hub. The memory buffers 340 of the memory blocks 310 and 320 are coupled with each other and with a memory controller 350 by means of a bus system 360.

The memory system 300 may be in particular a memory system based on Fully Buffered Dual Inline Memory Modules (FB-DIMM). In such an embodiment the memory buffers 340 represent Advanced Memory Buffers (AMB) of such a FB-DIMM memory system and each of the memory blocks 310 and 320 represents a FB-DIMM. Furthermore, the bus system 360 represents a point-to-point serial interface that connects the memory controller 350 with the memory buffer 340 of the first memory block 310 as well as the memory buffer 340 of the first memory block 310 with the memory buffer 340 of the second memory block 320 in a daisy chain manner. A not shown parallel bus system is provided for connecting the memory buffers 340 to the memory devices (memory chips) 330.

The memory controller 350 includes a first memory access unit 130, a second memory access unit 140, an allocation unit 150 and a scheduler 160 as described with reference to FIG. 1.

Figure 4:
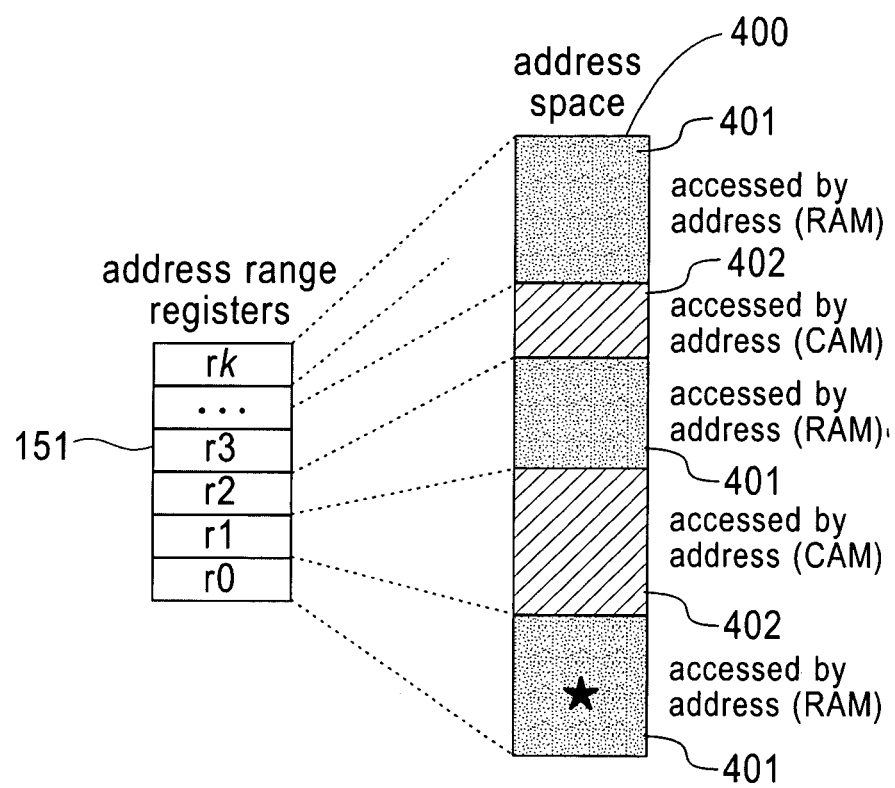
FIG. 4 is a schematic illustration of a mapping of an address space of a memory device on address range registers.

FIG. 4 illustrates a mapping of an address space 400 of the memory device 110 on the address range registers 151 of the allocation unit 150. The address space 400 includes first parts 401 that are allocated to the first memory access unit 130 and second parts 402 that are allocated to the second memory access unit 140. The address range registers 151 are provided for storing the address ranges of the first parts 401 and the second parts 402 of the address space 400. Each of the address range registers 151 is provided for storing as boundary a border address of the address ranges. As an example, the address range register r0 stores the lower border address of the lower first part 401, referenced with a *, of the address space and the register r1 stores the upper border address of the lower first part 401.

Figure 5:
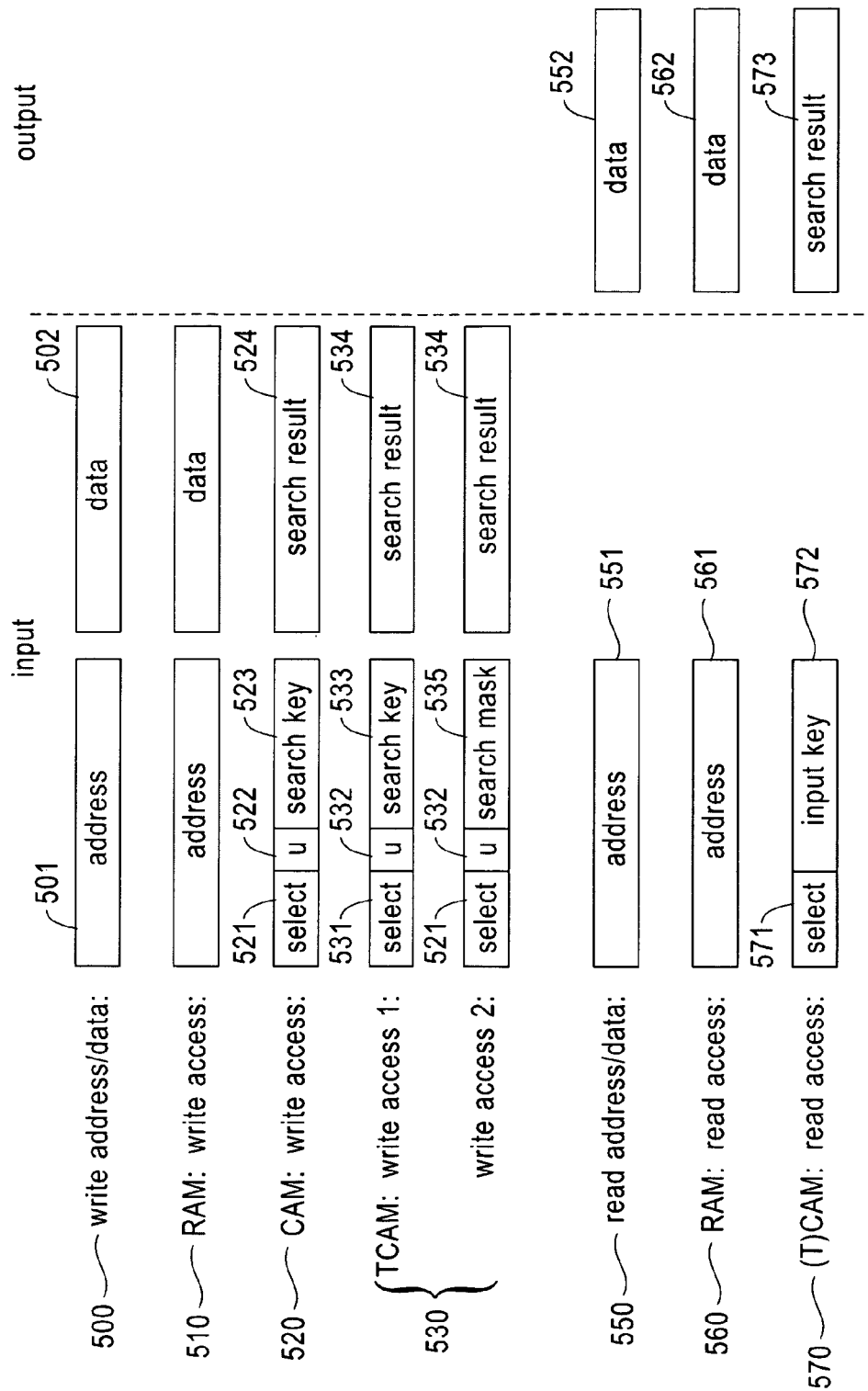
FIG. 5 is a schematic illustration of input and output data formats of a memory system embodying the invention.

FIG. 5 illustrates input and output data formats of messages or data exchanged between the processing unit 120, the first memory access unit 130, the second memory access unit 140 and the allocation unit 150 via the bus system 170. The available data space of the input and output data formats is defined by the width of the address lines 171, the data lines 172 and the control lines 173.

A write data format 500 includes an address field 501 and a data field 502 corresponding to the address lines 171 and the data lines 172. The write data format 500 illustrates the available write input space being provided by the bus system 170. According to an embodiment of the invention a mapping of the write data format 500 on data formats adapted for the use of the first memory access unit 130 and the second memory access unit 140 is provided. A RAM-write-access format 510 is provided for a direct and random memory write access of the first memory access unit 130. The RAM-write-access format 510 establishes a 1:1 mapping between the write data format 500 and the RAM-write-access format 510. A CAM-write-access format 520 is provided for a memory write access of the second memory access unit 140. The CAM-write-access format 520 includes a select field 521, a type of update field 522, a search key field 523 and a search result field 524. The select field 521, the type of update field 522 and the search key field 523 are mapped on the address field 501 and the search result field 524 is mapped on the data field 502.

The CAM-write-access format 520 is provided for a write-access operation of the second memory access unit 140. The select field 521, which establish in this example the most significant bits of the address field 501, is used to select a particular address range of the address space 400 of the memory device 110. Preferably, the possible values of the select field 521 and the address mapping stored in the address range registers 151 in the allocation unit 150, as shown for example in FIG. 4, will be assigned in correspondence with each other, enabling the use of the select field 521 to select between search tables that are stored within one or multiple CAM-style accessible portions (second parts 402) of the address space 400 of the memory device 110. The type of update field 522, denoted as "u" in FIG. 5, indicates the type of update, e.g. "add search entry" or "remove search entry", but additional search types such as "modify search entry" can be defined as well. A corresponding search entry comprising a search key and a search result involved in the update can be transmitted by means of the search key field 523 and the search result field 524. The search key establishes content data that can be searched for in the memory device 110 by the second memory access unit 140. The search result establishes the corresponding result of the search. As an example, the search key could be a name and the search result a corresponding address or telephone number. In addition, a Ternary CAM (TCAM)-write-access format 530 may be provided for a memory write access of the second memory access unit 140. A TCAM search allows a third matching state of "Don't Care". The TCAM-write-access format 530 as illustrated in FIG. 5 includes a first TCAM-write-access operation and a second TCAM-write-access operation. The format of the first TCAM-write-access operation includes a select field 531, a type of update field 532, a search key field 533 and a search result field 534. The format of the second TCAM-write-access operation includes a select field 531, a type of update field 532, a search mask field 535 and a search result field 534. The TCAM-write-access format 530 is provided for a write-access operation of the second memory access unit 140 in a TCAM-style. The search mask field 535 specifies the bits in the search key field 533 that have to be tested and the bits that are don't care. Dependent on the lengths of the search key and the search result, these can be mapped differently on the address and data values involved in one or multiple write accesses. Additional information, for example a relative priority between search entries, can be provided in a similar way.

These above described write-formats allow the operating system of the processing unit 120 to update the search structure of the second parts 402 of the address space 400 through the addition and/or removal of search entries.

A read data format 550 includes an address field 551 and a data field 552 corresponding to the address lines 171 and the data lines 172. The read data format 550 illustrates the available read output space being provided by the bus system 170. According to an embodiment of the invention a mapping of the read data format 550 on data formats adapted for the use of the first memory access unit 130 and the second memory access unit 140 is provided. A RAM-read-access format 560 is provided for a direct and random memory read access of the first memory access unit 130. The RAM-read-access format 560 establishes a 1:1 mapping between the read data format 550 and the RAM-read-access data format 560. A CAM/TCAM-read-access format 570 is provided for a memory read access of the second memory access unit 140. The CAM/TCAM-read-access format 570 includes a select field 571, an input key field 572 and a search result field 573. The select field 571 and the input key field 572 are mapped on the address field 551 and the search result field 573 is mapped on the data field 552. The CAM/TCAM-read-access format 570 is provided for a read-access operation of the second memory access unit 140. By means of such a read-access operation, a search function within the second memory access unit 140 will be invoked. This search function allows the operating system of the processing unit 120 to search the search structure stored in the second parts 402 of the address space 400 of the memory device 110 based on the input key in the input key field 572. The select field 571 is used to select the respective second part 402 of the address space 400 in which the search structure is stored. In case of a very wide input key, multiple CAM/TCAM read operations can be used to provide all bits of the input key to the search function. In that case, the result data of all read operations, except for the last one, will be neglected. The search function will now search the search structure that is stored in the memory device 110 using the input key of the input key field 572. Dependent on the type of search, a fixed or a variable number of read operations is executed. If the search is completed, then the search result will be included in the search result field 573 and send as a response to the processing unit 120.

Figure 6:
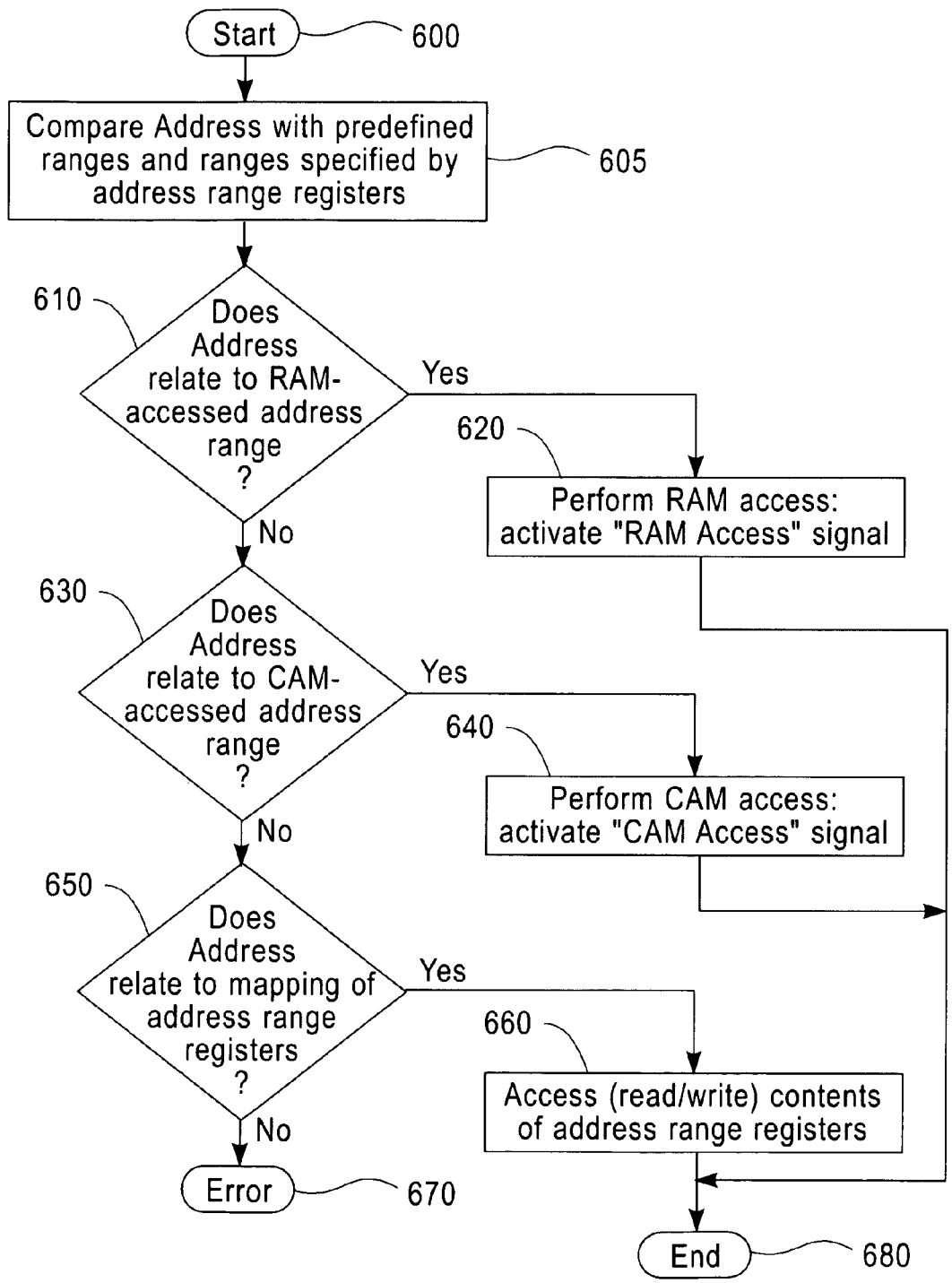
FIG. 6 shows a flow diagram of a method embodying the invention.

FIG. 6 illustrates a flow chart of a method embodying the invention. The method starts with a memory address sending step 600. In this memory address sending step 600 the processing unit 120 sends a memory address to the comparator 152. In a following address comparing step 605 the comparator 152 of the allocation unit 150 compares the received memory address with predefined address ranges and with address ranges that are specified by the address range registers 151. In a step 610 it is evaluated whether the received memory address is within an address range of the first part 401 of the address space 400. If this is true, the allocation unit 150 sends in a direct memory access step 620 a "select RAM access" signal to the first memory access unit 130 and the first memory access unit 130 performs an access of the memory device 110 by the memory address received from the processing unit 120. This memory access is preferably a direct and random memory access. If the result of the evaluation performed in step 610 is that the received address is not within an address range of the first part 401 of the address space 400, it is further evaluated in step 630 whether the received address is within an address range of the second part 402 of the address space 400. If this is true, the allocation unit 150 sends in search step 640 a "select CAM access" signal to the second memory access unit 140 and the second memory access unit 140 performs an access of the memory device 110 by content data received from the processing unit 120. In other words, the second memory access unit 140 controls a search for the content data in the memory device 110.

If the result of the evaluation performed in step 630 is that the received address is not within the address range of the second parts 402 of the address space 400 either, the comparator 152 checks in a step 650 whether the received memory address belongs to an address of the address range registers 151. If this is true, the allocation unit 150 performs in step 660 an access of the address range registers 151. This can be a read or a write access. A write access of the address range registers 151 can be used to write new values, i.e. new boundaries, in selected registers of the address range registers 151. By writing new values in selected registers, the processing unit 120 or the operating system executed on the processing unit 120 respectively can instantiate new search tables or new search structures in the memory device 110 by configuring additional parts of the address space 400 as second part 402 of the address space 400 allocated to the second memory access unit 140.

Figure 7:
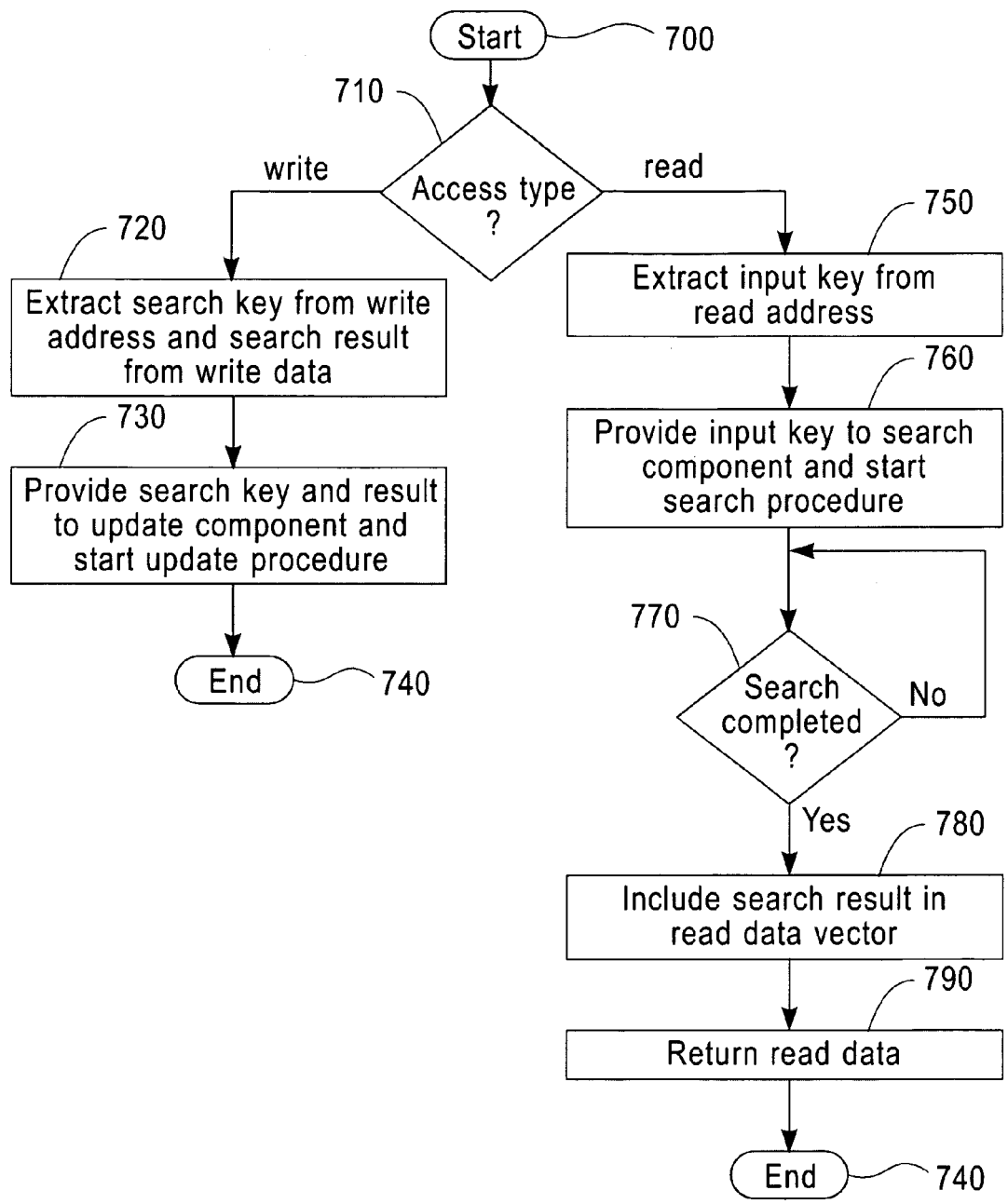
FIG. 7 shows a further flow diagram of a method embodying the invention.

FIG. 7 illustrates a flow chart of a method embodying the invention related to the functioning of the second memory access unit 140. The method starts in step 700, in which the second memory access unit 140 receives the "select CAM access" signal from the allocation unit 150. This indicates that the second memory access unit 140 shall perform an access of the memory device 110 by content data received from the processing unit 120 on the bus system 170. In step 710 it is evaluated whether the received content data relates to a read-operation or a write-operation. In case of a write-operation, the method is continued with a step 720, in which a search key is extracted from the search key field 523 and a corresponding search result from the search result field 524. In a following step 730 the search key and the corresponding search result are provided to the update unit 141 and the update unit 141 starts an update procedure for updating the corresponding search structure in the memory device 110 with the received search key and the received search result.

In case of a read-operation, the method is continued with a step 750, in which an input key is extracted from the input key field 572. In a following step 760 the input key is provided to the search unit 142 and the search unit 142 starts a search procedure and performs a search for the received input key in the corresponding search structure of the memory device 110. In step 770 it is checked whether the search has been completed. If this is the case, the search unit 142 includes in step 780 the search result in the search result field 573 and delivers in step 790 the search result to the processing unit 120 via the bus system 170.

Figure 8:
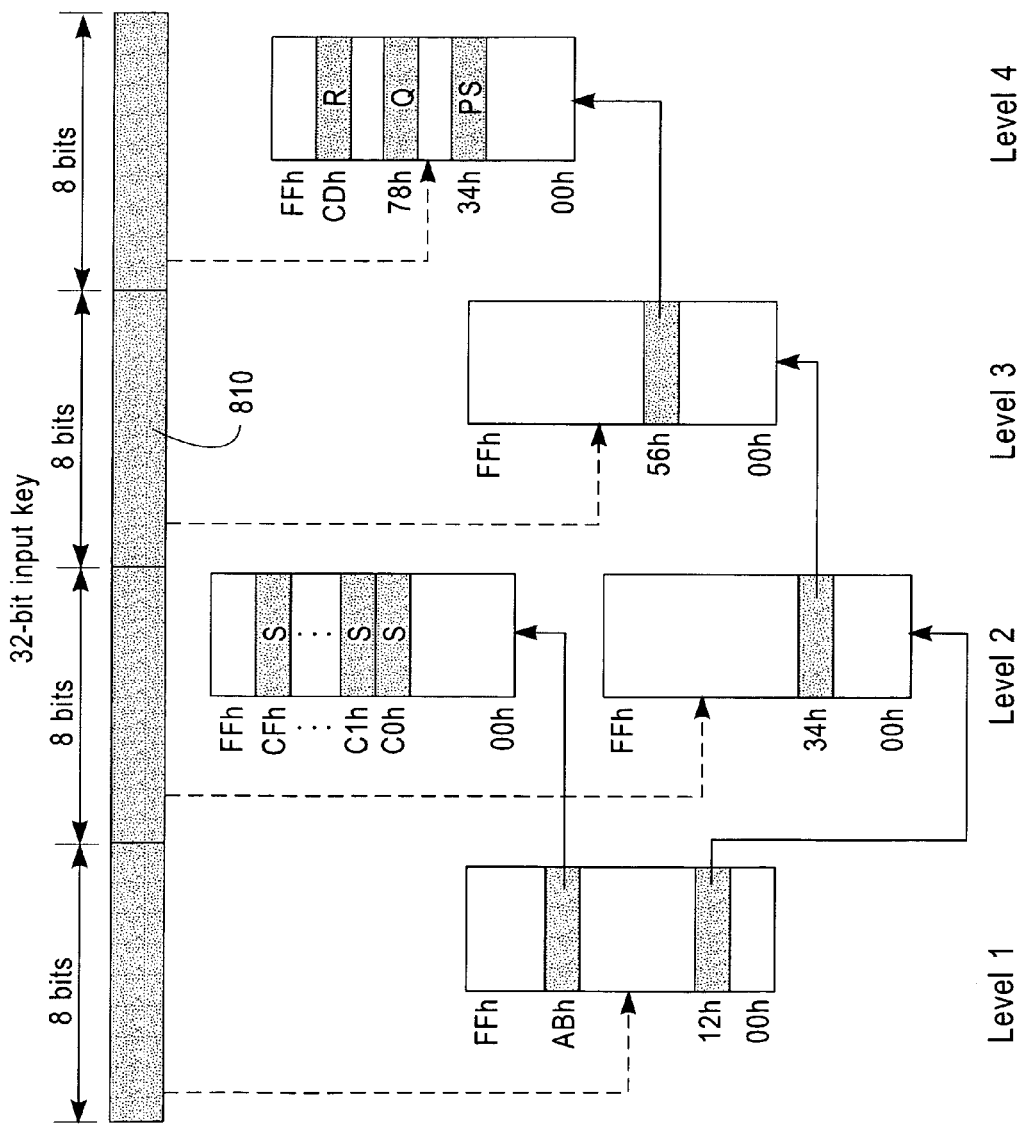
FIG. 8 illustrates a segmented search procedure based on a search structure with full search tables.
Figure 9:
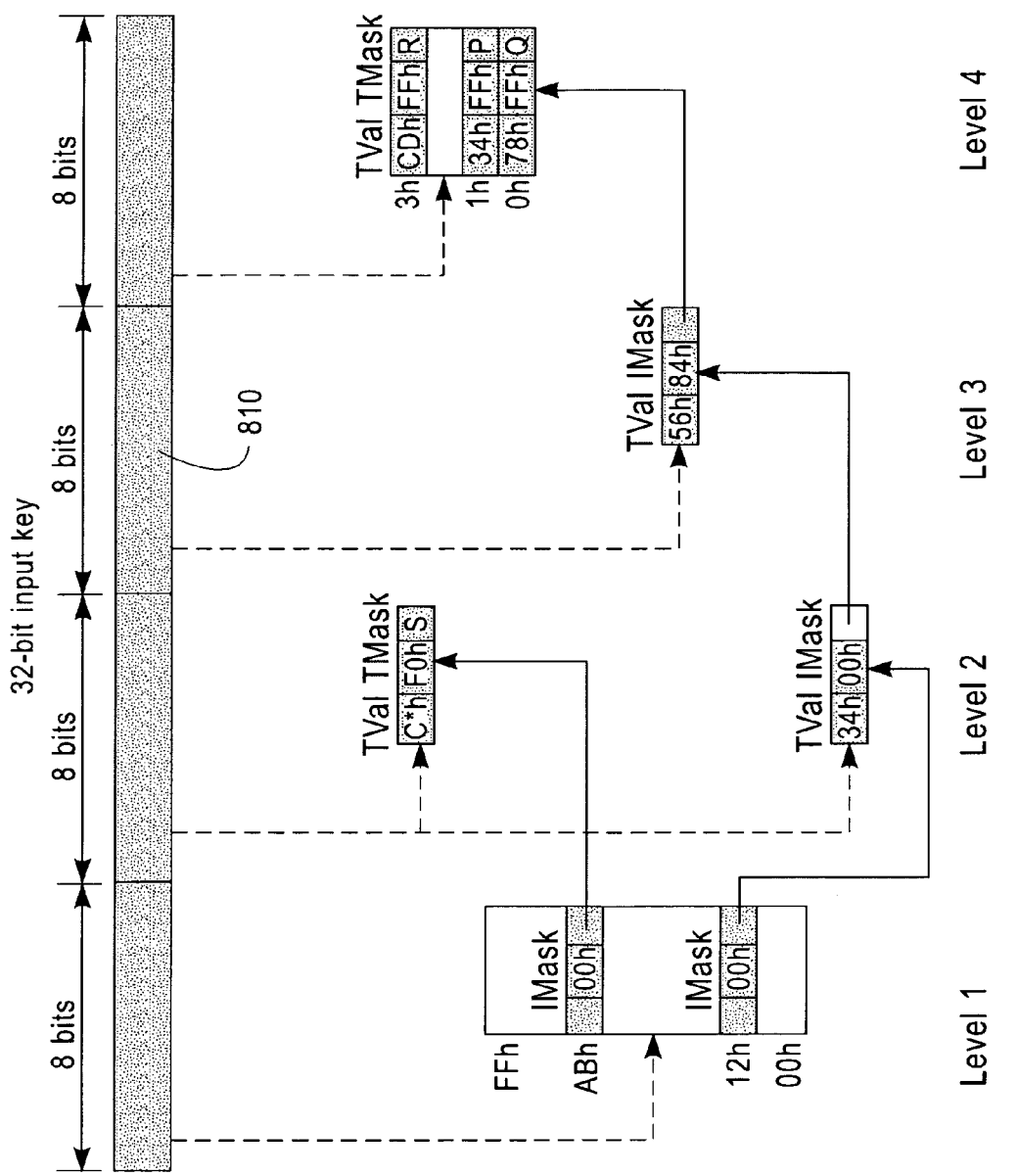
FIG. 9 is a schematic illustration of the segmented search procedure of FIG. 8 with compressed search tables.

FIG. 8 and FIG. 9 illustrate some aspects of a possible implementation of the search structure based on the Balanced Routing Table (BaRT) search algorithm. The BaRT search algorithm is explained in more detail in U.S. Pat. No. 6,782, 382 B2 which is incorporated herewith by reference. The BaRT search algorithm is a search algorithm that exploits a special type of hash function to support exact-, prefix- and range-match conditions in combination with a deterministic search performance, fast incremental updates and high storage efficiency. BaRT can be regarded as an algorithm that improves the storage efficiency of a search structure that is included in linked search tables, also denoted as lookup tables, that are indexed by selected portions of the input key, by independently compressing each of the lookup tables in the structure to obtain a substantial reduction in storage efficiency.

FIG. 8 illustrates an example of a search structure comprising uncompressed search tables, which implement a search on a 32-bit input key 810 for the following four entries:
(1) exact match on 32-bit vector 12345634h with a search result P
(2) exact match on 32-bit vector 12345678h with a search result Q
(3) exact match on 32-bit vector 123456CDh with a search result R
(4) prefix match on 12-bit prefix ABCh with a search result S The input key is divided into four segments of 8 bits which are used to index the search tables at the corresponding four levels as shown in FIG. 8. Each of these search tables can contain valid and invalid entries, where a valid entry can contain a pointer to a table at the next level or a search result, and an invalid entry indicates an invalid search result. The search operation starts with using the first segment as index into the search table at level 1. If the indexed entry of the search table contains a pointer to a table at the next level, then this search table will be indexed using the next segment. The search operation ends when an entry is indexed that contains a search result, which then will be the result of the search operation, or when an invalid entry is indexed in which case the result of the search operation will be an invalid result.

This is now illustrated for the input key '12345678h'. In FIG. 8 the first segment of this input key equals '12h' which is used as index into the table at level 1. This entry points to the lower table at level 2, which is indexed by the second segment of the input key which equals '34h'. This entry points to the only table at level 3, which is then indexed using the third segment of the input key which equals '56h'. This entry points to the only table at level 4, which is then indexed using the fourth segment of the input key which equals '78h'. This entry now provides the search result 'Q'.

The actual storage requirements of the search structure in FIG. 8 are dependent on the number and sizes of the segments in the input key 810 and the prefixes stored in the search structure.

FIG. 9 illustrates how the application of the BaRT algorithm can be used to compress the search tables in the search structure in order to increase the storage efficiency. FIG. 9 shows that a BaRT search structure includes multiple levels of linked hash tables that are each processed only once and in a fixed order for each search operation. This enables a very efficient pipelined implementation that can achieve a search rate of one search per memory access cycle. According to an embodiment of the invention the various levels of the BaRT search structure can be mapped on different memory blocks and/or memory devices of a FB-DIMM memory system as described with reference to FIG. 2 and FIG. 3. This enables a pipelined operation on these levels to obtain a high search rate of one search per memory access cycle.

The disclosed embodiments may be combined with one or several of the other embodiments shown and/or described. This is also possible for one or more features of the embodiments.

The described techniques may be implemented as a method, apparatus or article of manufacture involving software, firmware, micro-code, hardware and/or any combination thereof. The term "article of manufacture" as used herein refers to code or logic implemented in a medium, where such medium may include hardware logic [e.g., an integrated circuit chip, Programmable Gate Array (PGA), Application Specific Integrated Circuit (ASIC), etc.] or a computer readable medium, such as magnetic storage medium (e.g., hard disk drives, floppy disks, tape, etc.), optical storage (CD-ROMs, optical disks, etc.), volatile and non-volatile memory devices [e.g., Electrically Erasable Programmable Read Only Memory (EEPROM), Read Only Memory (ROM), Programmable Read Only Memory (PROM), Random Access Memory (RAM), Dynamic Random Access Memory (DRAM), Static Random Access Memory (SRAM), flash, firmware, programmable logic, etc.]. Code in the computer readable medium is accessed and executed by a processor. The medium in which the code or logic is encoded may also include transmission signals propagating through space or a transmission media, such as an optical fiber, copper wire, etc. The transmission signal in which the code or logic is encoded may further include a wireless signal, satellite transmission, radio waves, infrared signals, Bluetooth, etc. The transmission signal in which the code or logic is encoded is capable of being transmitted by a transmitting station and received by a receiving station, where the code or logic encoded in the transmission signal may be decoded and stored in hardware or a computer readable medium at the receiving and transmitting stations or devices. Additionally, the "article of manufacture" may include a combination of hardware and software components in which the code is embodied, processed, and executed. Of course, those skilled in the art will recognize that many modifications may be made without departing from the scope of embodiments, and that the article of manufacture may include any information bearing medium. For example, the article of manufacture includes a storage medium having stored therein instructions that when executed by a machine results in operations being performed.

Certain embodiments can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, certain embodiments can take the form of a computer program product accessible from a computer usable or computer readable medium providing program code for use by or in connection with a computer or any instruction execution system. For the purposes of this description, a computer usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

The terms "certain embodiments", "an embodiment", "embodiment", "embodiments", "the embodiment", "the embodiments", "one or more embodiments", "some embodiments", and "one embodiment" mean one or more (but not all) embodiments unless expressly specified otherwise. The terms "including", "comprising", "having" and variations thereof mean "including but not limited to", unless expressly specified otherwise. The enumerated listing of items does not imply that any or all of the items are mutually exclusive, unless expressly specified otherwise. The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries. Additionally, a description of an embodiment with several components in communication with each other does not imply that all such components are required. On the contrary a variety of optional components are described to illustrate the wide variety of possible embodiments. Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously, in parallel, or concurrently.

When a single device or article is described herein, it will be apparent that more than one device/article (whether or not they cooperate) may be used in place of a single device/article. Similarly, where more than one device or article is described herein (whether or not they cooperate), it will be apparent that a single device/article may be used in place of the more than one device or article. The functionality and/or the features of a device may be alternatively embodied by one or more other devices which are not explicitly described as having such functionality/features. Thus, other embodiments need not include the device itself.

Computer program means or computer program in the present context mean any expression, in any language, code or notation, of a set of instructions intended to cause a system having an information processing capability to perform a particular function either directly or after either or both of the following a) conversion to another language, code or notation; b) reproduction in a different material form.

The invention further provides a storage medium tangibly embodying a program of machine-readable instructions executable by a digital processing apparatus to carry out a method of accessing a memory device being addressable by means of an address space, the method comprising the steps of: sending a memory address by a processing unit to an allocation unit; comparing by the allocation unit the received memory address with a first part of the address space of the memory device and with a second part of the address space of the memory device; accessing the memory device by the received memory address, at times the received address is in the first part of the address space; and receiving content data from the processing unit and performing a search for the received content data in the memory device, at times the received memory address is in the second part of the address space.

What is claimed is:

1. An interfacing apparatus configured to couple a plurality of memory devices including a first memory device and a second memory device by means of an address space to a processing unit, the apparatus comprising:
    a first memory access unit being adapted for receiving a memory address corresponding to a first part of said address space in each of said first and second memory devices from said processing unit and for providing random access to a corresponding location in the first part of said address space based on the address provided;
    a second memory access unit being adapted for receiving content data from said processing unit and for controlling a search or update function accordingly for said received content data in a second part of said address space in each of said first and second memory devices;
    an allocation unit configured to parse memory addresses and then to allocate the first part of said address space in each said first and second memory devices to said first memory access unit and allocate the second part of said address space in each of said first and second memory devices to said second memory access unit; and
    said allocation unit having a plurality of address range registers provided for storing as boundary a border address of an address range of first and second address ranges corresponding to said first and second parts of said address space, respectively.

2. An apparatus according to claim 1, wherein the said second part of said address space of said memory device includes a memory for storing at least one search structure.

3. An apparatus according to claim 1, wherein said allocation unit comprises a comparator for comparing memory addresses received from said processing unit with said border addresses stored in said address range registers and for activating said first memory access unit or said second memory access unit in response to said received memory address, said address ranges each corresponding to one or more memory devices associated with said units.

4. An apparatus according to claim 1, wherein said address range registers are adapted for a direct access by said processing unit.

5. An apparatus according to claim 3, wherein said border addresses stored in said address range registers are mapped on address range select values for selecting one of said address ranges by said processing unit.

6. An apparatus according to claim 2, wherein said second memory access unit comprises an update unit adapted for updating said search structure stored in said memory device.

7. An apparatus according to claim 1, comprising a scheduler for scheduling access to said first and second memory devices between said first memory access unit and said second memory access unit.

8. An apparatus according to claim 1, further including a parallel bus system adapted for interfacing said memory device and said processing unit, said parallel bus system comprises address, data and control lines.

9. An apparatus according to claim 1, further including a serial bus system adapted for interfacing said first and second memory devices and said processing unit.

10. An apparatus according to claim 1, further including said processing unit coupled to said apparatus such that a memory controller allows for performing successive accesses to the memory device of said first and second memory devices involved in each search option.

11. An apparatus according to claim 10, wherein said memory controller may exchange only an input key and search results for said input key with an application that is executed on the processing unit.

12. An apparatus according to claim 1, further including a memory buffer.

13. A method for accessing a plurality of memory devices including a first memory device and a second memory device by means of an address space, said method comprising the steps of:
    receiving a memory address by an allocation unit from a processing unit;
    comparing by said allocation unit said received memory address with a first part of the address space in each of said first and second memory devices and with a second part of the address space in each of said first and second memory devices;
    accessing a memory device of said first and second memory devices by a random access technique using said received memory address in a state in which said received address is in said first part of said address space;
    allocating a plurality of address range registers each provided for storing as boundary a border address of an address range of first and second address ranges corresponding to said first and second parts of said address space, respectively;
    and receiving content data from said processing unit and performing a search for said received content data in a memory device of said first and second memory devices, when said received memory address is in said second part of said address space.

14. A method according to claim 13 further comprising the steps of:
    comparing said received memory addresses received from said processing unit with said border addresses stored in the address range registers; and activating said first memory access unit or said second memory access unit; said memory access units being in processing communication with one or more memory devices.

15. A method according to claim 14 further comprising the step of:

scheduling access to said first and second memory devices between said first memory access unit and said second memory access unit.

16. A non-transitory storage medium tangibly embodying a program of machine-readable instructions executable by a digital processing apparatus to carry out a method of accessing a plurality of memory devices being addressable by means of an address space, said method comprising the steps of:
receiving a memory address by an allocation unit from a processing unit;
comparing by said allocation unit said received memory address with a first part of the address space in each of said first and second memory devices and with a second part of the address space in each of said first and second memory devices;
accessing a memory device of said first and second memory devices by a random access technique using said received memory address in a state in which said received address is in said first part of said address space;
allocating a plurality of address range registers each provided for storing as boundary a border address of an address range of first and second address ranges corresponding to said first and second parts of said address space, respectively;
and receiving content data from said processing unit and performing a search for said received content data in a memory device of said first and second memory devices, when said received memory address is in said second part of said address space.

17. A method according to claim 13, wherein a memory controller and a buffer is provided, said memory buffer arranged between said memory devices and said memory controller.

18. A non-transitory storage medium according to claim 17, wherein said memory buffer allows for successive accesses to a memory device of said first and second memory devices.

19. A non-transitory storage medium according to claim 18 wherein said memory controller may exchange only an input key and search result for said input key with an application that is executed on the processing unit.

* * * * *